US010873323B2

United States Patent
Guo et al.

(10) Patent No.: US 10,873,323 B2
(45) Date of Patent: Dec. 22, 2020

(54) SYSTEMS AND METHODS FOR CALIBRATING IMPEDANCE OF A LOW POWER VOLTAGE-MODE TRANSMITTER DRIVER

(71) Applicant: Marvell Asia Pte, Ltd., Singapore (SG)

(72) Inventors: Fei Guo, Nanjing (CN); Yihui Li, San Jose, CA (US); Hong Xue, Shanghai (CN); Xin Ma, San Jose, CA (US); Hui Wang, Pleasanton, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 16/778,622

(22) Filed: Jan. 31, 2020

(65) Prior Publication Data

US 2020/0252057 A1  Aug. 6, 2020

Related U.S. Application Data

(63) Continuation-in-part of application No. 16/264,411, filed on Jan. 31, 2019.

(51) Int. Cl.
| | |
|---|---|
| *H03K 17/687* | (2006.01) |
| *H03K 19/00* | (2006.01) |
| *H03K 3/011* | (2006.01) |
| *H03H 11/28* | (2006.01) |
| *H03K 5/1252* | (2006.01) |

(52) U.S. Cl.
CPC ............ *H03K 3/011* (2013.01); *H03H 11/28* (2013.01); *H03K 5/1252* (2013.01); *H03K 17/687* (2013.01); *H03K 19/00* (2013.01)

(58) Field of Classification Search
CPC ...... H03K 3/011; H03K 5/1252; H03H 11/28; H03G 3/3063; H03M 1/1009; H03M 3/38
See application file for complete search history.

(56) References Cited

U.S. PATENT DOCUMENTS

| | | | |
|---|---|---|---|
| 4,305,009 A | 12/1981 | Miyagawa et al. | |
| 8,018,246 B2* | 9/2011 | Kaiwa | G11C 7/1051 326/27 |
| 9,148,198 B1 | 9/2015 | Zhang et al. | |
| 9,831,874 B1* | 11/2017 | Fortin | H03K 19/0005 |
| 10,067,519 B2* | 9/2018 | Leibowitz | G05F 1/462 |
| 2004/0136221 A1 | 7/2004 | Iwasaki | |
| 2011/0096067 A1 | 4/2011 | Guo et al. | |
| 2013/0300500 A1 | 11/2013 | Holzmann | |
| 2014/0254712 A1 | 9/2014 | Lee et al. | |
| 2016/0373141 A1 | 12/2016 | Chou et al. | |

* cited by examiner

*Primary Examiner* — Dinh T Le

(57) ABSTRACT

A low-power transmitter for transmitting digital signals from an integrated chip is described herein. The transmitter includes a voltage-mode transmitter driver comprised of a plurality of driver slices, which includes an up-cell having a first resistor and a first transistor, and a down-cell having a second resistor, a second transistor, and a third transistor. A calibration circuit drives a replica circuit to a desired impedance by adjusting a first gate voltage applied to the first transistor of the replica of the up-cell and adjusting a second gate voltage applied to the third transistor of the replica of the down-cell. The calibrated first gate voltage is applied to the first transistor and to the second transistor of each of the plurality of driver slices and the calibrated second gate voltage is applied to the third transistor of each of the plurality of driver slices.

20 Claims, 8 Drawing Sheets

SYSTEMS AND METHODS FOR CALIBRATING IMPEDANCE OF A LOW POWER VOLTAGE-MODE TRANSMITTER DRIVER

CROSS REFERENCE TO RELATED APPLICATION

This disclosure is also a continuation-in-part of and claims the benefit under 35 U.S.C. § 120 of commonly assigned and co-pending U.S. application Ser. No. 16/264,411, filed on Jan. 31, 2019. The aforementioned application is incorporated herein by reference in its entirety

FIELD OF USE

This disclosure relates to configuration of a low power transmitter driver, and specifically, for calibrating impedances of different cells at a low power voltage-mode transmitter driver.

BACKGROUND OF THE INVENTION

Voltage-mode transmitter drivers are often used in used in chip-to-chip connections in devices such as servers and routers. A voltage-mode transmitter driver usually has two cells, an UP-cell having a transistor and a resistor, and a DOWN-cell having a transistor and a resistor. The joint connecting the UP-cell and the DOWN-cell forms the output terminal of the voltage-mode transmitter driver.

High-speed chip-to-chip interconnection standards often require that the DOWN-cell impedance and the UP-cell impedance match a desired reference impedance to decrease the reflection along the interconnection that degrades signal integrity. In other words, the UP-cell impedance between the power supply ($V_S$) and the output terminal, and the DOWN-cell impedance between the output terminal and ground need to be equivalent to a certain reference impedance value. However, transistors in the UP-cell or the DOWN-cell are usually composed of large size n-type transistors. The resistance of a transistor often varies significantly due to different driving voltage levels, and can be rather volatile due to environmental factors such as temperature, humidity, vibration, etc. Thus, the varying resistances of the n-type transistors, especially during different operation modes of the transistors, in the UP-cell and the DOWN-cell can often lead to the mismatch between the UP-cell impedance and the DOWN-cell impedance. Such mismatch often causes excessive noise in the voltage-mode transmitter driver, and an unstable or even erroneous output at the output terminal of the voltage-mode transmitter driver.

SUMMARY

Embodiments described herein provide a low-power transmitter for transmitting digital signals from an integrated chip. The transmitter includes a voltage-mode transmitter driver comprised of a plurality of driver slices, where each driver slice includes an up-cell and a down-cell. The up-cell comprises a first resistor and a first transistor, where the up-cell is connected to a voltage source and an output end of the voltage-mode transmitter driver. The down-cell includes a second resistor, a second transistor, and a third transistor, where the down-cell is connected to the output end of the voltage-mode transmitter driver and a ground. The transmitter further includes a replica circuit comprising a replica of the up-cell and a replica of the down-cell. A calibration circuit of the transmitter is configured to drive the replica circuit to a desired impedance by adjusting a first gate voltage applied to the first transistor of the replica of the up-cell to be equal to a calibrated first gate voltage and tuning a second gate voltage applied to the third transistor of the replica of the down-cell to be equal to a calibrated second gate voltage. A bias generator applies the calibrated first gate voltage to the first transistor and to the second transistor of each of the plurality of driver slices and applies the calibrated second gate voltage to the third transistor of each of the plurality of driver slices.

In some embodiments, the up-cell of each of the plurality of driver slices is configured to generate an impedance matching an impedance of the corresponding down-cell of each of the plurality of driver slices in response to having the calibrated first gate voltage applied to the first transistor and to the second transistor of each of the plurality of driver slices and the calibrated second gate voltage applied to the third transistor of each of the plurality of driver slices.

In some embodiments, a total impedance of the up-cells of the plurality of driver slices is equal to the impedance of the replica of the up-cell in response to having the calibrated first gate voltage applied to the first transistor and to the second transistor of each of the plurality of driver slices and to the calibrated second gate voltage applied to the third transistor of each of the plurality of driver slices.

In some embodiments, a total impedance of the down-cells of the plurality of driver slices is equal to the impedance of the replica of the down-cell in response to having the calibrated first gate voltage applied to the first transistor and to the second transistor of each of the plurality of driver slices and the calibrated second gate voltage applied to the third transistor of each of the plurality of driver slices.

In some embodiments, the replica of the up-cell further includes a replica of the first resistor and a replica of the first transistor, wherein the replica of the up-cell is connected to the voltage source and the output end of the voltage-mode transmitter driver. The replica of the down-cell further includes a replica of the second resistor, a replica of the second transistor, and a replica of the third transistor, wherein the replica of the down-cell is connected to the output end of the voltage-mode transmitter driver and the ground.

In some embodiments, the calibration circuit further includes a second down-cell comprising a fourth transistor and a third resistor, and a constant current source configured to feed a constant current into the second down-cell to generate an output voltage, a comparator configured to compare the output voltage generated by the second down-cell to a first reference voltage and a second reference voltage, and a calibration logic control configured to adjust an impedance of the second down-cell to match a first pre-determined impedance based on an output of the comparator by tuning the second gate voltage via a bias generator.

In some embodiments, the bias generator is configured to lower the second gate voltage in response to the calibration logic control receiving a high-level output from the comparator indicative of an impedance of the second down-cell being low. In some embodiments, the bias generator is configured to increase the second gate voltage in response to the calibration logic control receiving a low-level output from the comparator indicative of an impedance of the second down-cell being high.

In some embodiments, the calibration circuit is further configured to (i) maintain, via the bias generator, the second gate voltage at a voltage at which the impedance of the second down-cell matches the first pre-determined impedance, (ii) adjust, via the bias generator, the first gate voltage to a voltage at which an impedance of the replica of the up-cell matches a second pre-determined impedance, and (iii) calibrate the first gate voltage to be a voltage at which the impedance of the replica of the up-cell matches the second pre-determined impedance.

In some embodiments, the calibration circuit is further configured to (i) maintain, via the bias generator, the calibrated first gate voltage, (ii) adjust, via the bias generator, the second gate voltage such that an impedance of the replica of the down-cell matches the second pre-determined impedance, and (iii) calibrate the second gate voltage to be a voltage at which the impedance of the replica of the down-cell matches the second pre-determined impedance.

In some embodiments, the bias generator is configured to supply the calibrated first gate voltage to the first transistor and the second transistor of each of the plurality of driver slices and supply the calibrated second gate voltage to the third transistor of each of the plurality of driver slices.

BRIEF DESCRIPTION OF DRAWINGS

Further features of the disclosure, its nature and various advantages will become apparent upon consideration of the following detailed description, taken in conjunction with the accompanying drawings, in which like reference characters refer to like parts throughout, and in which.

DETAILED DESCRIPTION

In view of the problem of impedance mismatch in a voltage-mode transmitter driver, systems and methods are described herein to independently calibrate respective impedances of the UP-cell and the DOWN-cell in a low power voltage-mode transmitter driver. In some embodiments, low power voltage-mode transmitter drivers are operative to technology systems such as servers and routers. These systems require high-speed low-power area-efficient chip-to-chip interconnections.

Figure 1:
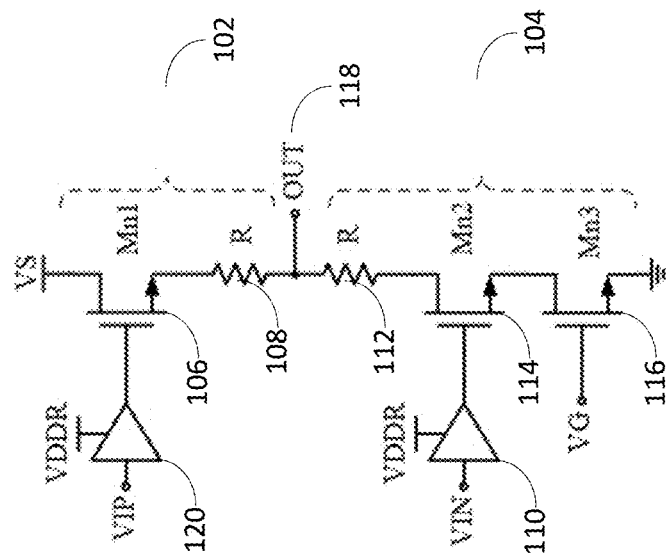
FIG. 1 is a block diagrams illustrating a low power voltage-mode transmitter driver using an additional transistor applied with a tunable gate voltage to calibrate the impedances of the Up-cell and the DOWN-cell, according to some embodiments described herein.
Figure 2:
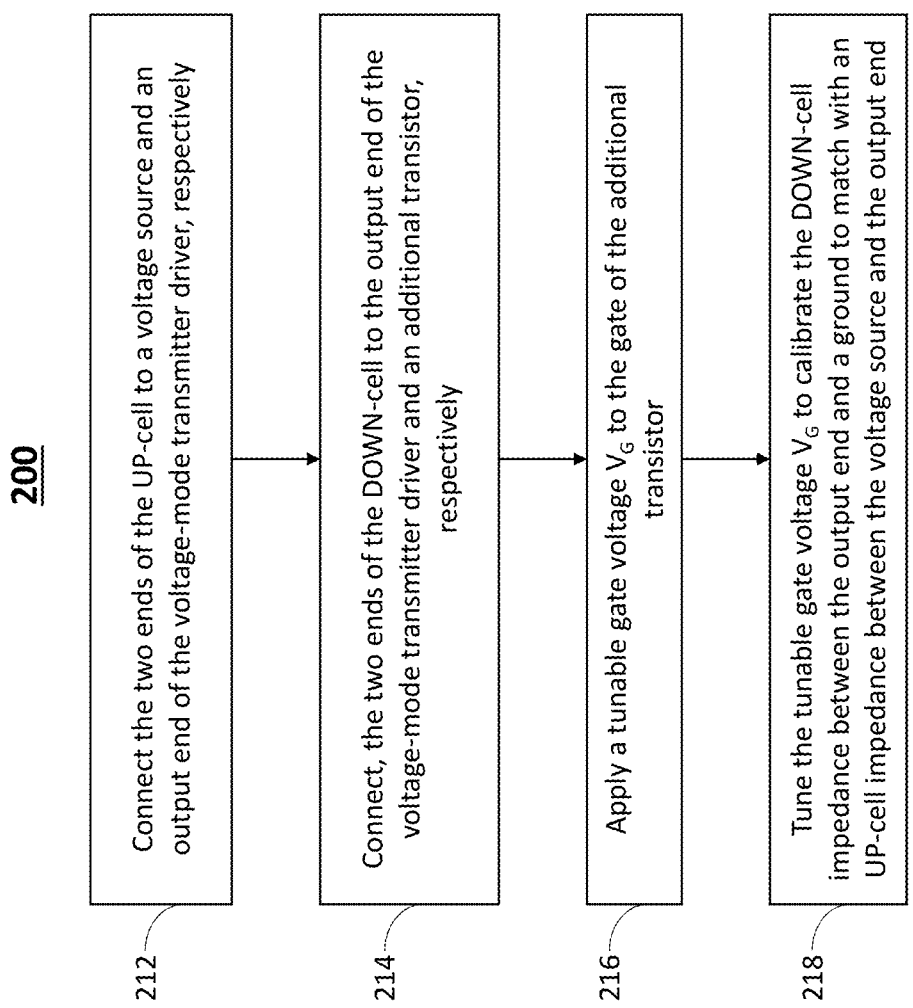
FIG. 2 is a logic flow diagram illustrating a process to operate the circuit shown in FIG. 1 for calibrating impedance of a voltage-mode transmitter, according to one embodiment described herein.

FIG. 1 is a circuit diagram 100 illustrating a low power voltage-mode transmitter driver using an additional transistor applied with a tunable gate voltage to calibrate the impedances of the UP-cell and the DOWN-cell, and FIG. 2 is a logic flow diagram illustrating a process to operate the circuit 100 shown in FIG. 1 for calibrating impedance of a voltage-mode transmitter, according to one embodiment described herein. Circuit diagram 100 of FIG. 1 illustrates a low-power voltage-mode driver modelled as having an UP-cell 102 and a DOWN-cell 104. UP-cell 102 and DOWN-cell 104 may be used to provide different bits of a data stream. The UP-cell 102 includes a transistor 106 and a resistor 108 having one terminal connected to the source of the transistor 106. The source of transistor 106 is connected to a voltage source ($V_S$). The other terminal of the resistor 108 is connected to output 118 of the voltage-mode transmitter driver. In traditional transmitter drivers, a value for resistor 108 is chosen to ensure that the output impedance measured at output terminal 118 is matched to a desired impedance. In such embodiments, the UP cell impedance may be measured as $R(108)+1/Gmn1(106)$, where Gmn1 (106) is transconductance of device 106. For example, in traditional transmitters, when the desired impedance is 50 Ohm, a suitable electrical resistance value for resistor 108 may be chosen. The gate terminal of the transistor 106 is connected to an output terminal of voltage driver 120. The voltage driver 120 has an input voltage of $V_{IP}$ and a tunable driving voltage $V_{DDR}$. The driving voltage $V_{DDR}$ is tuned, in an implementation, to vary the output voltage from the voltage driver 120 applied to the gate of transistor 106, and thereby modify the resistance of transistor 106, which in turn changes the impedance of the UP-cell 102 between the voltage source $V_S$ and the output terminal 118.

The DOWN-cell 104 includes a resistor 112 having one terminal connected to the output 118, and the other terminal connected to the drain of transistor 114. Transistor 114 is driven by a voltage driver 110, which is similar to voltage driver 120, with an input voltage of $V_{IN}$ and the same tunable driving voltage $V_{DDR}$. Similar to the UP-cell, impedance of the DOWN-cell between the output end 118 and the ground can be changed by tuning the tunable driving voltage $V_{DDR}$.

An additional transistor 116 is connected to the source of transistor 114. Specifically, the source terminal of the transistor 114 is connected to the drain terminal of the n-type transistor 116. The source terminal of the n-type transistor 116 is connected to ground.

The gate terminal of n-type transistor 116 is connected to a tunable gate voltage ($V_G$). In addition to $V_{DDR}$, the gate voltage $V_G$ can be tuned to change the resistance of transistor 116, which in turn changes the impedance of the DOWN-cell.

In some embodiments, the transistor 116 may be a p-type transistor instead of an n-type transistor as shown in FIG. 1. In such embodiments, other transistors 106 and 114 may also be p-type transistors instead of n-type transistors.

Circuit 100 as shown in FIG. 1 is operated as shown at process 200 in FIG. 2. At 212, the drain and source terminals of the transistor 106 of UP-cell 102 are connected to the voltage source $V_S$ and the output end 118 of the voltage-mode transmitter driver, respectively. At 214, the drain and source terminals of transistor 114 of the DOWN-cell 104 are connected to the output 118 of the voltage-mode transmitter driver and to ground via the additional transistor 116, respectively. At 216, tunable gate voltage $V_G$ is applied to the gate of the additional transistor 116. At 218, voltage level of gate voltage $V_G$ is tuned to render the DOWN-cell impedance between the output end 118 and a ground to match an impedance of UP-cell between the voltage source $V_S$ and the output end 118. By tuning $V_G$, the output impedance variation between the impedance of UP-cell 102 and the impedance of DOWN-cell 104 can be decreased.

Figure 3:
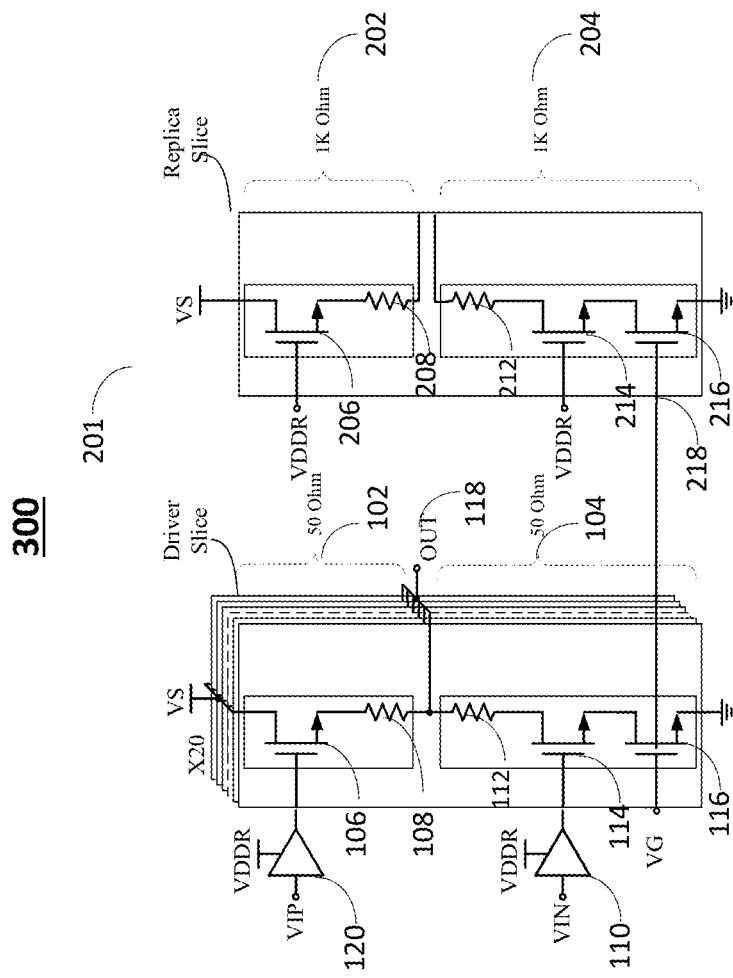
FIG. 3 is a circuit diagram illustrating a voltage-mode transmitter driver slice and a replica slice to calibrate impedances in the voltage-mode transmitter driver, according to some embodiments described herein.

FIG. 3 is a circuit diagram illustrating a voltage-mode transmitter driver slice and a replica slice to calibrate impedances in the voltage-mode transmitter driver, according to some embodiments described herein. In an implementation, a plurality of identical copies (referred to as "slices") of the transmitter driver 100 of FIG. 1 are connected in parallel as shown in FIG. 3. Each driver slice includes instantiations of UP-cell 102, DOWN-cell 104 and additional transistor 116. The same voltage driver 120 and 110 may be applied to the UP-cells and DOWN-cells in all driver slices.

The respective impedance of UP-cell or DOWN—can be set to match a desired reference value. For example, a desired impedance of the UP-cell 102 of the low power voltage-mode transmitter driver is 50 ohms. Similarly, a desired impedance of the DOWN-cell 104 of the low power voltage-mode transmitter driver is also 50 ohms so as to match the desired UP-cell impedance. To achieve the target impedance of 50 ohms for both the UP-cell 102 and the DOWN-cell 104, for instance when there are 20 driver slices connected in parallel, each driver slice may need to be tuned to a have a respective UP-cell impedance of 1K ohm. The net impedance of 20 driver slices connected in parallel may be measured using the formula:

$$Z_{Net} = \frac{Z}{n}$$

Where Z is 1k ohms (of each driver slice) and n is the number of driver slices (20) to yield $Z_{Net}$ of 50 ohms. In some embodiments, to achieve a different target impedance of the voltage-mode transmitter driver 100, each driver slice may be tuned to render a different impedance value for the respective UP-cell or DOWN-cell impedance.

In order to achieve the desired impedance in the UP-cell 102 and the DOWN-cell 104 of the voltage-mode transmitter driver, a replica slice 201 that is similar to the original driver slice is connected to the original parallelly connected driver slices. By tuning the replica slice to the value of 1k ohm, each driver slice of the 20 driver slices may be tuned to an impedance of 1k ohm. This will eventually lead to calibration of the impedance of the UP-cell 102 and DOWN-cell 104 of transmitter driver 100 to the desired value of 50 ohm. The replica slice 201 includes a replica UP-cell 202 and a replica DOWN-cell 204. The replica UP-cell 202 includes transistor 206 which is a replica of transistor 106 and resistor 208 which is a replica of resistor 108. The replica DOWN-cell 204 includes transistor 214 which is a replica of transistor 114 and resistor 212 which is a replica of resistor 112, and replica transistor 216 which is a replica of transistor 116. All the replica components are connected in a similar way as the components are connected in driver 100. Driving voltage $V_{DDR}$ is applied to the gate terminals of the transistors 206 and 214.

Figure 4:
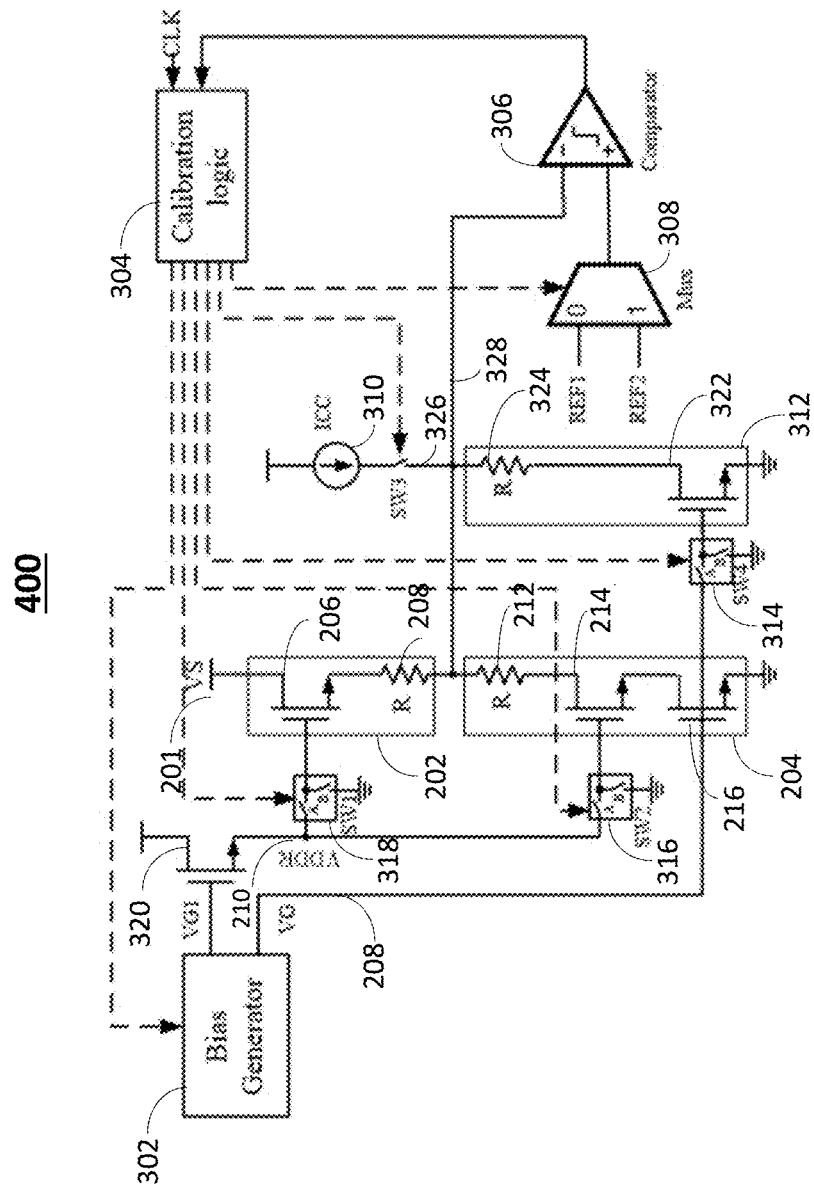
FIG. 4 illustrates a circuit diagram of a calibration circuit to calibrate impedances of the UP-cell and Down-cell in the replica slice 201 to the desired impedance value, according to some embodiments herein.

The tunable voltages $V_G$ and $V_{DDR}$ are to be tuned to calibrate impedances of the replica UP-cell 202 and the replica DOWN-cell 204 to a desired value (1K ohm in this case). As the replica slice is connected to the driver slices in parallel via connection 218, when the impedances in the replica slice reaches the desired value, the tuned voltages $V_G$ and $V_{DDR}$ in turn calibrate the impedances in each original driver slice to reach the desired value (1K ohm in this case). FIGS. 4-5C further describes aspects of calibrating the replica slice 201.

FIG. 4 illustrates a circuit diagram of a calibration circuit to calibrate respective impedances of the UP-cell and Down-cell in the replica slice 201 to the desired impedance value, according to some embodiments herein. In some embodiments, the respective impedances of UP-cell 202 and of Down Cell 201 are calibrated independently of each other. The independent calibration of impedance of the UP-cell 202 and DOWN-cell 204 happens with independent voltages $V_G$ and $V_{G1}$ tuned by bias generator 302 controlled by calibration logic 304. Calibration circuit 400 is setup to tune replica slice 201. The gate terminal of the transistor 206 of replica UP-cell 202 of replica slice 201 is connected to a switch box 318. Switch box 318 has a switch A, that, when closed, connects the gate terminal of replica transistor 206 to $V_{DDR}$ 210. Switch box 318 has another switch B, that when closed, connects the gate terminal of replica transistor 206 to ground. Similarly, the gate terminal of the transistor 214 of replica UP-cell 202 of replica slice 201 is connected to a switch box 316. Switch box 316 has a switch A, that, when closed, connects the gate terminal of transistor 214 to $V_{DDR}$ 210. Switch box 316 has another switch B, that when closed, connects the gate terminal of transistor 214 to ground. Replica transistor 216 is connected to $V_G$ 208.

Additionally, $V_{DDR}$ 210 is connected to the source terminal of transistor 320. The drain terminal of transistor 320 is connected to power source $V_S$. The gate terminal of transistor 320 is connected to a bias generator 302, which in turn outputs biased output voltages $V_{G1}$ to apply at the gate of transistor 320, and $V_G$ 208 to apply at the gate of replica transistor 216. By tuning $V_{G1}$, the bias generator 302 indirectly changes $V_{DDR}$ 210 through transistor 320. The bias generator 302 is controlled by a calibration logic unit 304, which sends signals to the bias generators to tune the output voltages $V_G$ and $V_{G1}$ (and $V_{DDR}$ indirectly), such that the replica UP-cell 202 and replica DOWN-cell 204 of the replica slice 201 both render a desired impedance value.

The calibration logic unit 304 receives two inputs: a clock and an output from a comparator 306. In addition to controlling the bias generator 302, the calibration logic unit 304 also controls switch box 318, switch box 316, switch box 314, switch 326, and a select bit of multiplexer 308, as further described below. Comparator 306 compares measured voltage level at output terminal 328 with a reference voltage value retrieved from multiplexer 308.

In order to tune the impedance of the replica UP-cell 202 independently from the impedance of replica DOWN-cell 204, a second DOWN-cell 312 is added in parallel to replica DOWN-cell 204 in the calibration circuit 300. DOWN-cell 312 includes a transistor 322 and a resistor 324. The source terminal of transistor 322 is connected to ground, and the drain terminal of the transistor 322 is connected to resistor 324. The gate terminal of transistor 322 is connected to a switch box 314. Switch box 314 has a switch A, which, when connected applies voltage $V_G$ (connected to the bias generator 302) to the transistor 322. Additionally, switch box 314 has another switch 314B, that, when connected, connects the gate terminal of the transistor 322 to ground. Resistor 324 of DOWN-cell 312 is connected to a switch 326, that connects the resistor 324 to a current source 310.

In order to calibrate the impedances of the replica UP-cell 202, replica DOWN-cell 204, and DOWN-cell 312, the voltage level is measured at output terminal 328. The measured voltage level at output terminal 328 is compared to a reference voltage value at comparator 306. Specifically, there are different reference voltage values that may be selected from multiplexer 308 by the calibration logic 304. The calibration logic 304 provides a selection signal to multiplexer 308 to cause the multiplexer 308 to output one of the available reference voltage values, e.g., based on the stage of calibration. Additionally, based on the output value of the comparator 306, the calibration logic unit 304 sends a signal to the bias generator 302 to tune the output voltages $V_G$ and $V_{G1}$, or modifies any of the switches 314, 316, 318 and 326. The detailed operation of different components of circuit diagram 400 is further described in relation to FIGS. 5A-C.

In some embodiments, an impedance of the replica UP-cell 202 is calibrated first and a corresponding value for $V_{DDR}$ 210 is fixed. Subsequently, the impedance of replica DOWN-cell 204 may be calibrated by tuning the voltage $V_G$ 208. In order to tune the impedance of replica UP-cell 202, DOWN-cell 312 is deployed. The impedance of DOWN-cell 312 is governed by the resistor 324 and transistor 322. In some embodiments, to achieve a desired impedance of 1K ohms in the replica UP-cell 202 and replica DOWN-cell 204 of the replica slice 201, the impedance of the DOWN-cell 312 is to be fixed at 3K ohms. The desired impedance value of 3k ohm for DOWN-cell 312 is selected based on a desired impedance value for UP-cell 102 and DOWN-cell 104. In some embodiments, if the desired value of impedance for UP-cell 102 and DOWN-cell 104 is different from 50 ohm, the desired value of impedance of DOWN-cell 312 may be different.

Figure 5A:
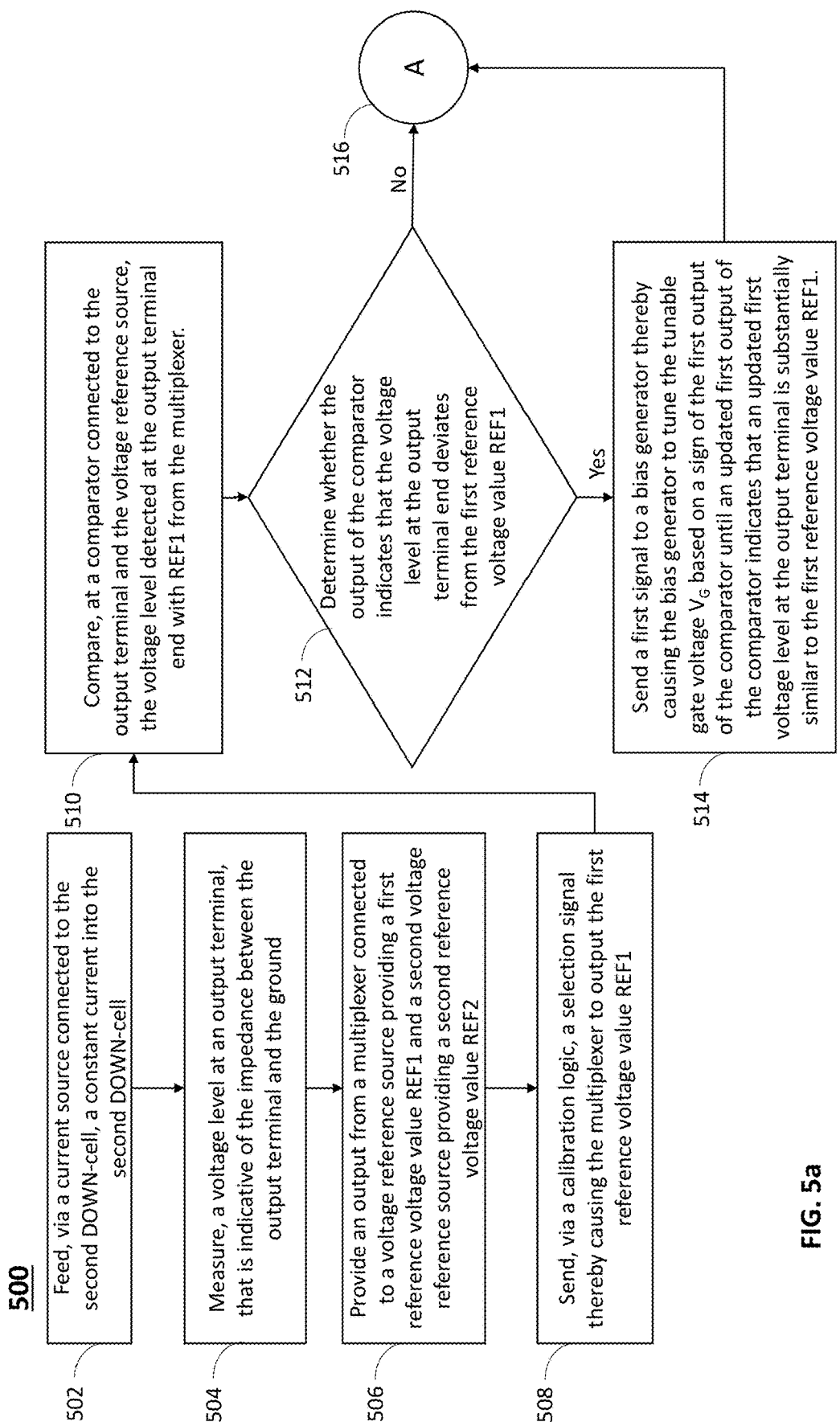
FIGS. 5a-c is a logic flow diagram illustrating a process 500 to operate the circuit shown in FIG. 4 for calibrating the impedances in a replica slice 201, according to one embodiment described herein.
Figure 5B:
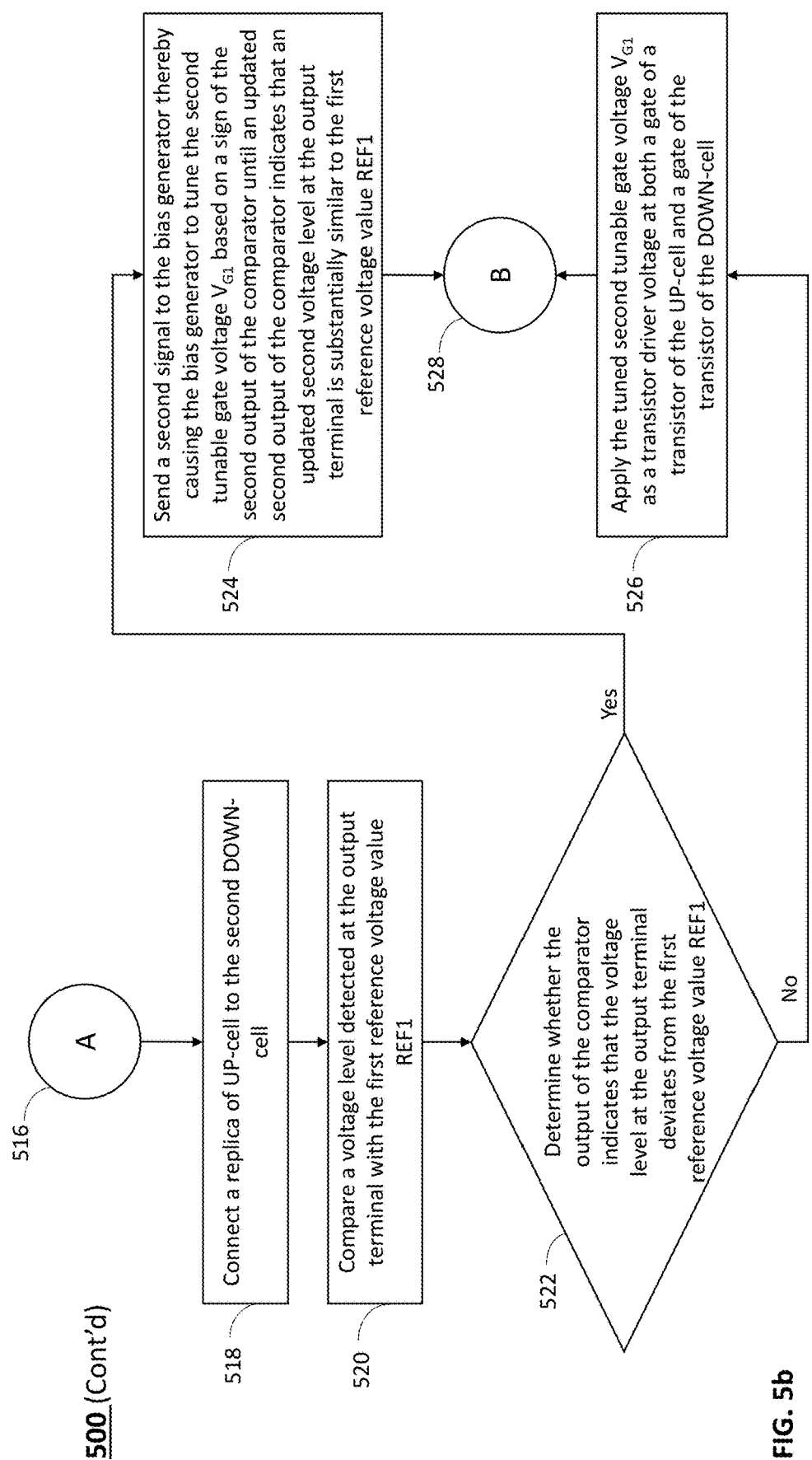
Figure 5C:
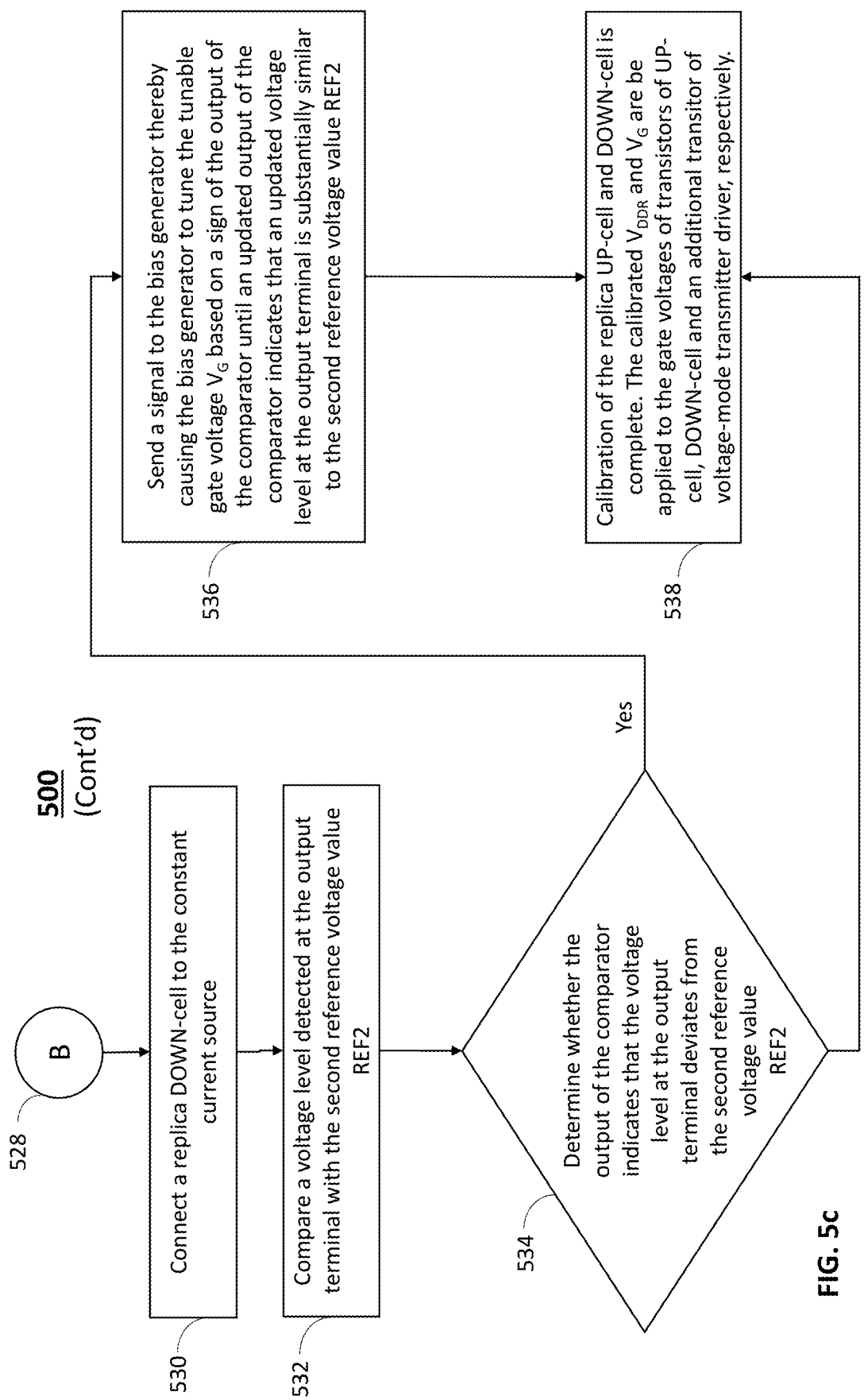

FIGS. 5A-C is a logic flow diagram illustrating a process 500 to operate the circuit shown in FIG. 4 for calibrating the impedances in a replica slice 201, according to one embodiment described herein.

In accordance with an example embodiment, DOWN-cell 312 is first calibrated such that the impedance of DOWN-cell 312 is set to a desired value (e.g., 3k ohm in this case). At the beginning of impedance calibration of DOWN-cell 312, the calibration logic 304 sends control signals to close switch B at 318, switch B at 316, switch 326, and switch A at 314. Simultaneously, the calibration logic 304 sends control signals to open switch A at 318, switch A at 316, and switch B at 314. By controlling the switches in this manner, transistors 206 and 214 effectively are removed from the circuit, and transistor 322 is connected to current source 310. The calibration logic 304 selects REF1 as the reference voltage from the multiplexer 308, for a reference input to the comparator 306. The second input of the comparator 304 is the voltage measured at output terminal 328.

Specifically, at 502, a constant current from a constant current source 310 is fed to the DOWN-cell 312. This may generate a voltage across the DOWN-cell 312 that may be measured at output terminal 328.

At 504, a voltage level at output terminal 328 is measured, the measured voltage level being indicative of the impedance between the output terminal 328 and the ground. As shown in FIG. 4, the measure voltage level at output terminal 328 is fed into a negative terminal of comparator 306.

At 506, an output is provided from multiplexer 308 connected to a first voltage reference source providing a first reference voltage value REF1 and a second voltage reference source providing a second reference voltage value REF2. At 508, calibration logic unit 304 sends a selection signal thereby causing the multiplexer 308 to output one of the first reference voltage value REF1 and the second reference voltage value REF2. For example, in order to calibrate an impedance across DOWN-cell 312, REF1 reference voltage is selected. In some embodiments, the reference voltage values REF1 and REF2 are pre-defined based on the desired impedance of the UP-cell 102 and the DOWN-cell 104.

At 510, comparator 306 compares the first voltage level detected at the output terminal 328 with reference voltage value REF1 from the multiplexer 308. The output of the comparison that indicates whether the voltage level at output terminal 328 is greater or less than, or substantially similar to the reference voltage REF1 is sent to calibration logic unit 304. As used herein, "substantially similar" is used to mean that two entities are almost identical or equivalent with a tolerable difference due to limited measurement precision.

At 512, calibration logic unit 304 governs whether the output of the comparator 306 indicates that the voltage level at the output terminal 328 deviates from the first reference voltage value REF1.

In response to determining that the output of the comparator 306 indicates that the voltage level at the output terminal 328 deviates from REF1, calibration logic unit 304 sends a signal to bias generator 302 thereby causing the bias generator 302 to tune the tunable gate voltage $V_G$ based on a sign of the output of the comparator 306, until an updated output of the comparator 306 indicates that an updated voltage level at the output terminal 328 is substantially similar to the reference voltage value REF1.

For example, in some embodiments, a high positive output from the comparator 306 implies that the voltage at output terminal 328 is too low, and the calibration logic unit 304 will instruct the bias generator 302 to decrease the $V_G$ voltage so as to increase the voltage measured across DOWN-cell 312. Similarly, calibration logic 304 may instruct the bias generator 302 to increase the $V_G$ 208 if the output of the comparator 306 is low. In some embodiments, the output from multiplexer 308 may be connected to the negative terminal of comparator 306 and the output terminal 328 may be connected to the positive terminal of the comparator 306. In such cases, the response of the calibration logic will also be the opposite of the previous embodiment.

Eventually, the modification of $V_G$ using bias generator 302 based on the signals from the calibration logic unit 304 may bring the voltage at 328 substantially similar to, or at least within a predetermined tolerable range of the REF1 voltage. In such embodiments, a slight increase or decrease in $V_G$ will flip the comparator output from high to low or from low to high. At this time, the calibration of the DOWN-cell 312 to the desired impedance of 3K ohms is complete.

Once the voltage at output terminal 328 measured across DOWN-cell 312 reaches a desired value (REF1), replica slice 201 is connected with DOWN-cell 312 to be calibrated. Calibration of replica UP-cell 202 is performed by connecting DOWN-cell 312 to replica UP-cell 202. The calibration logic 304 achieves this configuration by closing switch A at 318, switch B at 316, and switch A at 314, and opening switch B at 318, switch A at 316, switch 326 and switch B at 314. Calibration logic 304 selects REF1 as the voltage reference from multiplexer 308. The voltage REF1 is fed to the positive input of the comparator 306. Calibration logic 304 instructs the bias generator 302 to lock the value of voltage $V_G$ configured from the calibration of the DOWN-cell 312.

At 518, replica UP-cell 202 is connected to the DOWN-cell 312. Based on the switch configuration selected by calibration logic 304 as discussed above, replica DOWN-cell 204, and current source 310 are removed from the calibration circuit 300. Replica UP-cell 202 and DOWN-cell 312 are part of the calibration circuit 300. Once replica UP-cell 202 is connected to DOWN-cell 312, a voltage level is measured at output terminal 328.

At 520, comparator 306 compares the voltage level detected at the output terminal 328 with the first reference voltage value REF1.

At decision block 522, calibration logic 304 determines whether the output of the comparator 306 indicates that the second voltage level at the output terminal 328 deviates from the first reference voltage value REF1. The output of the comparator is provided to calibration logic 304. Based on the results, the calibration logic 304 controls the voltage supplied by the bias generator 302 to the calibration circuit 300 via $V_{G1}$ 208.

At 524, in response to determining that the output of the comparator 306 indicates that the voltage level at the output terminal 328 deviates from the first reference voltage value REF1, calibration logic 304 sends a second signal to the bias generator 302 thereby causing the bias generator 302 to tune the second tunable gate voltage $V_{G1}$ based on a sign of the second output of the comparator 306 until an updated second output of the comparator 306 indicates that an updated second voltage level at the output terminal is substantially similar to the first reference voltage value REF1.

At 526, in response to determining that the output of the comparator 306 indicates that the first voltage level at the output terminal 328 does not deviate from, but is substantially similar to the first reference voltage value REF1, calibration logic 304 applies the tuned second tunable gate voltage $V_{G1}$ as a transistor driver voltage at both a gate of the transistor 106 and a gate of the second transistor 114.

As described during the calibration of DOWN-cell 312 previously, the calibration logic 304 controls the bias generator 302 to tune the voltage $V_{G1}$ to change $V_{DDR}$ based on the results received from comparator 306. During this process, the voltage $V_G$ is maintained at the value selected during the time of calibration of DOWN-cell 312. In some embodiments, when the output of comparator 306 is high, means the impedance of the Replica UP-cell 202 is too large, and the calibration logic will instruct the bias generator 302 to increase the $V_{G1}$ voltage in order to increase $V_{DDR}$ 210 and thereby decrease impedance of replica UP-cell 202. On the other hand, calibration logic unit 304 will instruct the bias generator 302 to reduce the voltage $V_{G1}$ in order to reduce voltage $V_{DDR}$ 210 if the output of the comparator is low. The process is repeated until the voltage measured at 328 is within a tolerable range of REF1 voltage.

Once the voltage at output terminal 328 is substantially similar to REF1, it is noted, in accordance with Ohm's law (V=I×R), that the impedance of the replica UP-cell 202 is 1K ohm. The calibration logic 304 switches the configuration of calibration circuit 300 to calibrate the impedance of the replica DOWN-cell 204 to 1K ohm.

Continuing on with 530, DOWN-cell 204 is connected to the constant current source 310 while the calibration logic 304 sends control signals to close switch B at 318, switch A at 316, switch 326, and switch B at 314, and open switch A at 318, switch B at 314 and switch A at 316. The calibration logic 304 selects REF2 at multiplexer 308 as the reference voltage to be fed into the positive input of comparator 306. The reference voltage is swapped from REF1 to REF2, because the desired impedance for Replica DOWN-cell 204 is different from the desired impedance for DOWN-cell 312. According to this configuration of calibration circuit 300, the replica UP-cell 202 and DOWN-cell 312 are removed from the circuit. Replica DOWN-cell 204 is connected to current source 310. The current source 310 will feed a fixed amount of current into replica DOWN-cell 204 to generate a voltage across replica DOWN-cell 204 that may be measured at 328.

At 532, comparator 306 compares the voltage measured at output terminal 328 with the REF2 reference voltage received from multiplexer 308. Calibration logic 304 changes the selection bit value of multiplexer 308 to select REF2 instead of REF1. The output of the comparison is fed to calibration logic 304.

At 534, the calibration logic 304 determines whether the output of the comparator indicates that the voltage level at the output terminal 328 deviates from the second reference voltage value REF2.

At 536, in response to determining that the output of the comparator indicates that the voltage level at the output terminal 328 deviates from the second reference voltage value REF2, calibration logic 304 sends a signal to the bias generator 302 thereby causing the bias generator 302 to tune the first tunable gate voltage $V_G$ based on a sign of the output of the comparator until an updated output of the comparator 306 indicates that an updated voltage level at the output terminal 328 is substantially similar to the second reference voltage value REF2. The calibration logic is configured to instruct the bias generator 302 to modify the value of $V_G$ until the measured voltage at output terminal 328 is substantially similar to the REF2 voltage, while keeping the value of $V_{G1}$ fixed at the previously determined value. In some embodiments, when the output of the comparator is high, the impedance of the replica DOWN-cell 204 is too low, and the calibration logic 304 will instruct the bias generator 302 to lower the voltage $V_G$ voltage in order to increase the impedance of replica DOWN-cell 204. Similarly, the calibration logic 304 will instruct the bias generator 302 to increase the voltage $V_G$ if output of the comparator is low. Calibration of the replica slice is finished when the DOWN-cell impedance is tuned to the desire range.

At 538, in response to determining that the output of the comparator indicates that the voltage level at the output terminal 328 does not deviate from the second reference voltage value REF2, the calibration process is complete. After tuning the impedance of DOWN-cell 312, replica of the replica UP-cell 202 and replica of the replica DOWN-cell 204 to desired values, the calibration process is complete. The calibrated $V_{DDR}$ and $V_G$ will be applied to the gate voltages of transistors 106, 114, and 116 of voltage-mode transmitter driver 100 respectively.

Figure 6:
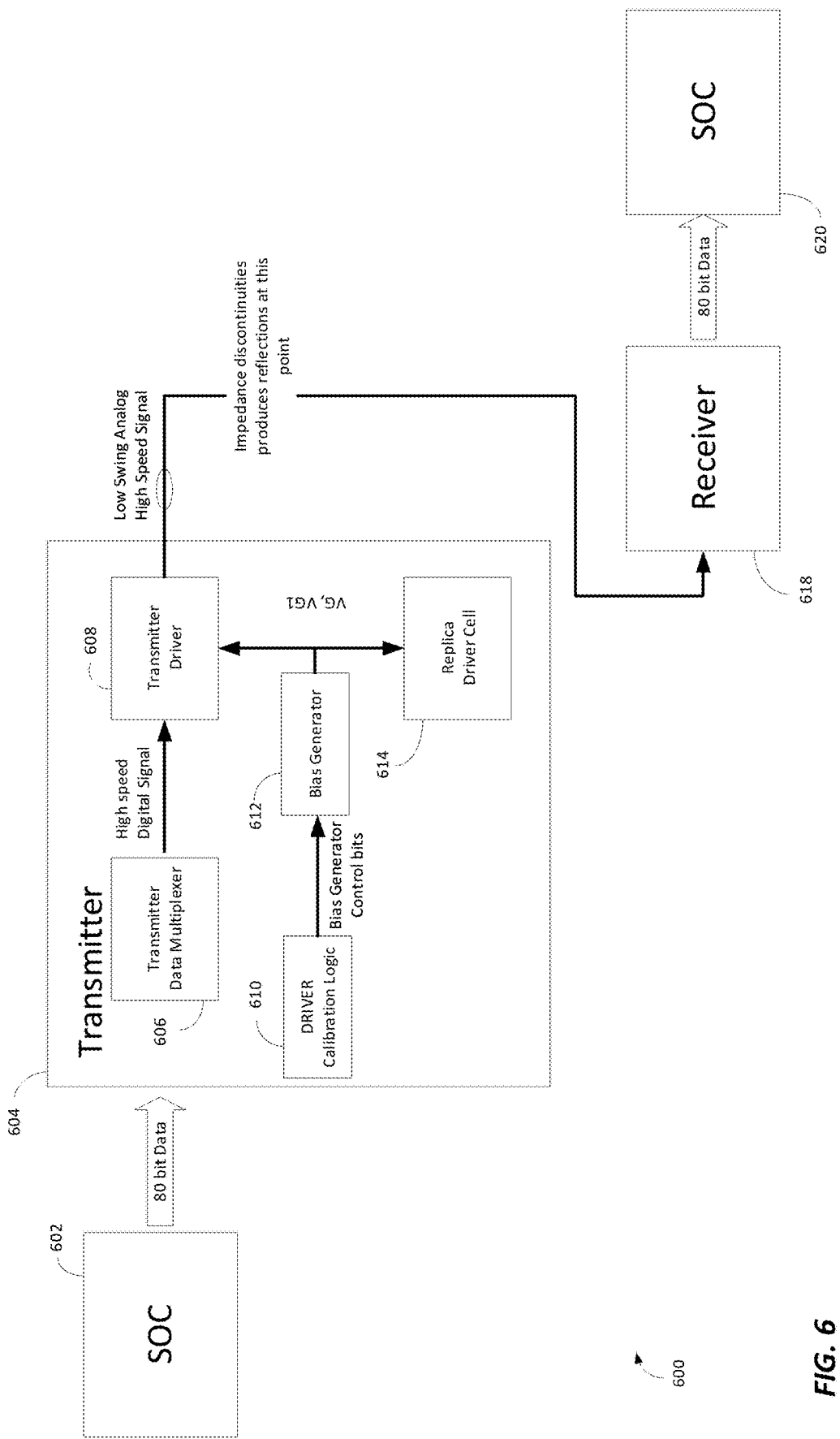
FIG. 6 is a system diagram of a low-power transmitter, according to one embodiment described herein.

FIG. 6 illustrates a system diagram of a low-power transmitter, according to one embodiment described herein. As shown in FIG. 6, a digital signal to be transmitted from one integrated chip (System-on-chip 602) to another integrated chip (System-on-chip 620) via a low-power physical layer transmitter 604. Specifically, as shown in FIG. 6, an 80-bit data is transmitted from the SOC 602 to the transmitter 604 to be transmitted to SOC 620.

Transmitter 604 includes a Transmitter Data Multiplexer 606, a transmitter driver 608, a Calibration Logic 610, a Bias Generator 612, and a Replica Driver Cell 614. The Calibration Logic 610 is configured to, via the Bias Generator 612, drive the Replica Driver Cell 614 to a desired impedance. Specifically, the Calibration Logic 610 adjusts the first gate voltage (VG1) and the second gate voltage (VG) applied to the Replica Driver. Once the impedance of Replica Driver Cell 614 reaches the desired impedance (e.g., 1k ohms), the Bias Generator applies the calibrated first gate voltage VG1 and the calibrated second gate voltage VG to the transmitter driver 608 (e.g., low power voltage-mode transmitter driver 100).

As discussed above with reference to FIGS. 5A-C, the Calibration Logic 610 controls the Bias Generator 612 to set the first gate voltage VG1 and the second gate voltage VG to be a calibrated first gate voltage and calibrated second gate voltage, respectively. Once calibrated first gate voltage VG1 and the calibrated second gate voltage VG are applied to the transmitter driver 608 (e.g., first gate voltage VG1 is applied to first transistor 106 of the up-cell 102 of each driver slice and to second transistor 114 of the down-cell 104, and second gate voltage VG is applied to third transistor 116 of the down-cell 104 as shown in FIG. 1), the impedance of the up-cell 102 and the down-cell 104 are matched.

In conventional transmitter design, because of impedance discontinuity of the up-cell 102 and the down-cell 104, reflections are generated during transmission from transmitter 604 to the SOC 620. However, the transmitter design described herein provides a matched impedance at the transmitter driver 608. Therefore, when the High-speed digital signal to be transmitted is converted into a low swing Analog high speed signal, there are no reflections produced, thus improving the overall system performance. The transmitted low swing Analog high speed signal is received at the physical layer of Receiver 618 before being sent to the SOC 620.

While operations are depicted in the drawings in a particular order, this is not to be construed as requiring that such operations be performed in the particular order shown or in sequential order, or that all illustrated operations be performed to achieve the desirable results.

The subject matter of this specification has been described in terms of particular aspects, but other aspects can be implemented and are within the scope of the following claims. For example, the actions recited in the claims can be performed in a different order and still achieve desirable results. As one example, the process depicted in FIGS. 4-7 does not necessarily require the particular order shown, or sequential order, to achieve desirable results. In certain implementations, multitasking and parallel processing may be advantageous. Other variations are within the scope of the following claims.

What is claimed is:

1. A low-power transmitter for transmitting digital signals from an integrated chip, the transmitter comprising:
    a voltage-mode transmitter driver comprised of a plurality of driver slices, wherein each driver slice includes:
        an up-cell comprising a first resistor and a first transistor, wherein the up-cell is connected to a voltage source and an output end of the voltage-mode transmitter driver; and
        a down-cell comprising a second resistor, a second transistor, and a third transistor, wherein the down-cell is connected to the output end of the voltage-mode transmitter driver and a ground;
    a replica circuit comprising a replica of the up-cell and a replica of the down-cell; and
    a calibration circuit configured to drive the replica circuit to a desired impedance by adjusting a first gate voltage applied to a first transistor of the replica of the up-cell to be equal to a calibrated first gate voltage and adjusting a second gate voltage applied to a third transistor of the replica of the down-cell to be equal to a calibrated second gate voltage; and
    a bias generator configured to:
    receive the calibrated first gate voltage and the calibrated second gate voltage from the calibration circuit; and
    apply the calibrated first gate voltage to the first transistor and to the second transistor of each of the plurality of driver slices and apply the calibrated second gate voltage to the third transistor of each of the plurality of driver slices.

2. The low-power transmitter according to claim 1, wherein, in response to having the calibrated first gate voltage applied to the first transistor and to the second transistor of each of the plurality of driver slices and the calibrated second gate voltage applied to the third transistor of each of the plurality of driver slices, the up-cell of each of the plurality of driver slices is configured to generate an impedance matching an impedance of the corresponding down-cell of each of the plurality of driver slices.

3. The low-power transmitter according to claim 2, wherein, in response to having the calibrated first gate voltage applied to the first transistor and to the second transistor of each of the plurality of driver slices and to the calibrated second gate voltage applied to the third transistor of each of the plurality of driver slices, a total impedance of the up-cells of the plurality of driver slices is equal to the impedance of the replica of the up-cell.

4. The low-power transmitter according to claim 2, wherein, in response to having the calibrated first gate voltage applied to the first transistor and to the second transistor of each of the plurality of driver slices and the calibrated second gate voltage applied to the third transistor of each of the plurality of driver slices, a total impedance of the down-cells of the plurality of driver slices is equal to the impedance of the replica of the down-cell.

5. The low-power transmitter according to claim 1, wherein the replica of the up-cell further comprises:
    a replica of the first resistor and a replica of the first transistor, wherein the replica of the up-cell is connected to the voltage source and the output end of the voltage-mode transmitter driver;
    wherein the replica of the down-cell further comprises:
    a replica of the second resistor, a replica of the second transistor, and a replica of the third transistor, wherein the replica of the down-cell is connected to the output end of the voltage-mode transmitter driver and the ground.

6. The low-power transmitter according to claim 5, wherein the calibration circuit further comprises:
    a second down-cell comprising a fourth transistor and a third resistor;
    a constant current source configured to feed a constant current into the second down-cell to generate an output voltage;
    a comparator configured to compare the output voltage generated by the second down-cell to a first reference voltage and a second reference voltage; and
    a calibration logic control configured to adjust an impedance of the second down-cell to match a first pre-determined impedance based on an output of the comparator by tuning the second gate voltage via a bias generator.

7. The low-power transmitter according to claim 6, wherein the bias generator is configured to lower the second gate voltage in response to the calibration logic control receiving a high-level output from the comparator indicative of an impedance of the second down-cell being low; and
    wherein the bias generator is configured to increase the second gate voltage in response to the calibration logic control receiving a low-level output from the comparator indicative of an impedance of the second down-cell being high.

8. The low-power transmitter according to claim 6, wherein the calibration circuit is further configured to:
    maintain, via the bias generator, the second gate voltage at a voltage at which the impedance of the second down-cell matches the first pre-determined impedance;

adjust, via the bias generator, the first gate voltage to a voltage at which an impedance of the replica of the up-cell matches a second pre-determined impedance; and calibrate the first gate voltage to be a voltage at which the impedance of the replica of the up-cell matches the second pre-determined impedance.

9. The low-power transmitter according to claim 8, wherein the calibration circuit is further configured to:

maintain, via the bias generator, the calibrated first gate voltage;

adjust, via the bias generator, the second gate voltage such that an impedance of the replica of the down-cell matches the second pre-determined impedance; and calibrate the second gate voltage to be a voltage at which the impedance of the replica of the down-cell matches the second pre-determined impedance.

10. The low-power transmitter according to claim 9, wherein the bias generator is configured to supply the calibrated first gate voltage to the first transistor and the second transistor of each of the plurality of driver slices and supply the calibrated second gate voltage to the third transistor of each of the plurality of driver slices.

11. A method for transmitting digital signals from an integrated chip via a low-power transmitter comprised of a plurality of driver slices, the method comprising:

calibrating, via a calibration circuit of the low-power transmitter, a first gate voltage and a second gate voltage by adjusting a first gate voltage applied to a first transistor of a replica circuit to be equal to a calibrated first gate voltage and adjusting a second gate voltage applied to a third transistor of the replica circuit to be equal to a calibrated second gate voltage;

applying, to a first transistor of an up-cell of each of the plurality of driver slices, the calibrated first gate voltage;

applying, to a second transistor of a down-cell of each of the plurality of driver slices, the calibrated first gate voltage; and applying, to a third transistor of the down-cell of each of the plurality of driver slices, the calibrated second gate voltage.

12. The method according to claim 11, wherein, in response to having the calibrated first gate voltage applied to the first transistor and to the second transistor of each of the plurality of driver slices and the calibrated second gate voltage applied to the third transistor of each of the plurality of driver slices, the up-cell of each of the plurality of driver slices is configured to generate an impedance matching an impedance of the corresponding down-cell of each of the plurality of driver slices.

13. The method according to claim 12, wherein, in response to having the calibrated first gate voltage applied to the first transistor and to the second transistor of each of the plurality of driver slices and to the calibrated second gate voltage applied to the third transistor of each of the plurality of driver slices, a total impedance of the up-cells of the plurality of driver slices is equal to the impedance of the replica of the up-cell.

14. The method according to claim 12, wherein, in response to having the calibrated first gate voltage applied to the first transistor and to the second transistor of each of the plurality of driver slices and the calibrated second gate voltage applied to the third transistor of each of the plurality of driver slices, a total impedance of the down-cells of the plurality of driver slices is equal to the impedance of the replica of the down-cell.

15. The method according to claim 11, wherein calibrating, via the calibration circuit of the low-power transmitter, the first gate voltage and the second gate voltage by driving the replica circuit of the low-power transmitter to a desired impedance comprises:

feeding a constant current via a constant current source into a second down-cell to generate an output voltage;

comparing, via a comparator, the output voltage generated by the second down-cell to a first reference voltage and a second reference voltage; and adjusting, via a calibration logic control, an impedance of the second down-cell to match a first pre-determined impedance based on an output of the comparator by tuning the second gate voltage via a bias generator.

16. The method according to claim 15, further comprising:

decreasing, via the bias generator, the second gate voltage in response to the calibration logic control receiving a high-level output from the comparator indicative of an impedance of the second down-cell being low.

17. The method according to claim 15, further comprising:

increasing, via the bias generator, the second gate voltage in response to the calibration logic control receiving a low-level output from the comparator indicative of an impedance of the second down-cell being high.

18. The method according to claim 15, further comprising:

maintaining, via the bias generator, the second gate voltage at a voltage at which the impedance of the second down-cell matches the first pre-determined impedance;

adjusting, via the bias generator, the first gate voltage to a voltage at which an impedance of the replica of the up-cell matches a second pre-determined impedance; and calibrating the first gate voltage to be a voltage at which the impedance of the replica of the up-cell matches the second pre-determined impedance.

19. The method according to claim 18, further comprising:

maintaining, via the bias generator, the calibrated first gate voltage;

adjusting, via the bias generator, the second gate voltage such that an impedance of the replica of the down-cell matches the second pre-determined impedance; and calibrating the second gate voltage to be a voltage at which the impedance of the replica of the down-cell matches the second pre-determined impedance.

20. The method according to claim 19, further comprising:

supplying, via the bias generator, the calibrated first gate voltage to the first transistor and the second transistor of each of the plurality of driver slices and supply the calibrated second gate voltage to the third transistor of each of the plurality of driver slices.

* * * * *